(12) United States Patent
Moon et al.

(10) Patent No.: US 8,665,664 B2
(45) Date of Patent: Mar. 4, 2014

(54) SEMICONDUCTOR MEMORY DEVICE, MEMORY SYSTEM INCLUDING THE SAME, AND METHOD FOR ADJUSTING TIMING BETWEEN INTERNAL CLOCK AND COMMAND

(75) Inventors: Jinyeong Moon, Gyeonggi-do (KR); Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 348 days.

(21) Appl. No.: 12/833,048

(22) Filed: Jul. 9, 2010

(65) Prior Publication Data
US 2011/0205818 A1    Aug. 25, 2011

(30) Foreign Application Priority Data
Feb. 25, 2010    (KR) ................ 10-2010-0017385

(51) Int. Cl.
*G11C 8/18*    (2006.01)
(52) U.S. Cl.
USPC ............................................. 365/233.11

(58) Field of Classification Search
USPC ....................................................... 365/233.1
See application file for complete search history.

(56) References Cited

U.S. PATENT DOCUMENTS

| | | | |
|---|---|---|---|
| 7,508,697 B1 * | 3/2009 | Mukhopadhyay et al. ... | 365/154 |
| 2003/0067015 A1 * | 4/2003 | Drexler ................... | 257/200 |
| 2009/0161455 A1 * | 6/2009 | Ku et al. .................. | 365/193 |
| 2009/0323878 A1 * | 12/2009 | Konishi et al. ............ | 375/365 |
| 2009/0327792 A1 * | 12/2009 | Salmon et al. ............ | 713/501 |
| 2010/0246290 A1 * | 9/2010 | MacLaren et al. ......... | 365/193 |

OTHER PUBLICATIONS

Notice of Preliminary Rejection issued from Korean Intellectual Property Office on Jun. 17, 2011.

* cited by examiner

*Primary Examiner* — Hoai V Ho
*Assistant Examiner* — Min Huang
(74) *Attorney, Agent, or Firm* — IP & T Group LLP (57) ABSTRACT

A method for adjusting a timing between an internal clock and a command in a gear down mode of a memory device includes detecting a sync pulse at rising and falling edges of the internal clock, and adjusting between the internal clock of the memory device and the command according to the detection result.

13 Claims, 5 Drawing Sheets

SEMICONDUCTOR MEMORY DEVICE, MEMORY SYSTEM INCLUDING THE SAME, AND METHOD FOR ADJUSTING TIMING BETWEEN INTERNAL CLOCK AND COMMAND

CROSS-REFERENCE(S) TO RELATED APPLICATIONS

The present application claims priority of Korean Patent Application No(s). 10-2010-0017385, filed on Feb. 25, 2010, which is incorporated herein by reference in its entirety.

BACKGROUND OF THE INVENTION

Exemplary embodiments of the present invention relate to a semiconductor memory device, and more particularly, to technology for easily adjusting a timing between an internal clock and a command in a gear down mode of a memory device.

A next generation semiconductor memory device such as a DDR4 memory device may employ a gear down mode which will be described below.

The target operating speed of a DDR4 memory device is 3,200 Mbps. In such a high speed operation, it may be difficult to achieve a high productivity while ensuring a setup/hold margin between a command and a clock. Thus, a memory device may use an internal clock whose frequency is lowered to half the frequency of data clocks (CK, CK#). This mode is called a gear down mode.

The use of the gear down mode may increase a pulse width of the internal clock because the frequency of the internal clock is lowered to half the frequency of the data clocks. Hence, the setup/hold margin may be ensured up to the level of a 1,6000-Mpbs memory device. However, since the internal clock is not a full rate clock, information on the relationship between a command and a clock may be lost. Therefore, a timing adjusting between an internal clock and a command may be required in order to compensate the lost of information on the relationship between the command and the clock.

Figure 1:
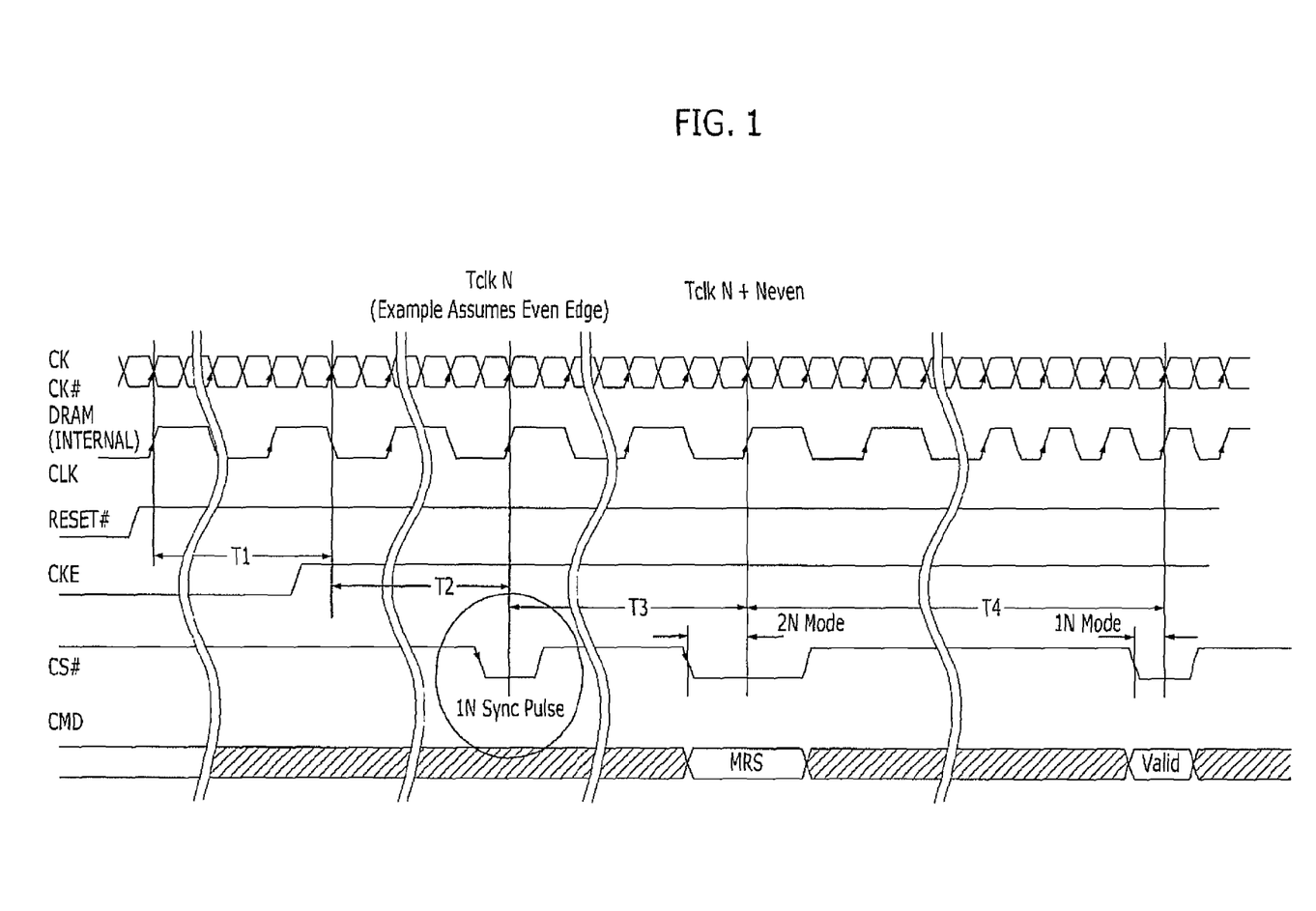
FIG. 1 is a timing diagram illustrating a method for treating a gear down mode after an initial power-up of a memory device.

FIG. 1 is a timing diagram illustrating a gear down mode after an initial power-up of a memory device.

The memory device may begin a power-up in the gear down mode in which an internal clock INTERNAL_CLK has half the frequency of data clocks CK and CK#. After the power-up of the memory device, a reset signal RESET# may be deactivated to a high level and a clock enable signal CKE may be activated to a high level. This situation may represent that a rank inside the memory device is selected. Before the memory device is set by a mode register setting, it is necessary to know at which edge the internal clock INTERNAL_CLK is aligned by comparison with the data clocks CK and CK#, and it is necessary to know at which edge the internal clock INTERNAL_CLK is aligned with the command. A sync pulse may be used to get such information.

The sync pulse may be applied via a pad through which a chip select signal CS# is inputted.

SUMMARY OF THE INVENTION

An embodiment of the present invention is directed to a method for adjusting a timing between an internal clock and a command in a gear down mode of a memory device.

In accordance with an exemplary embodiment of the present invention, a method for adjusting a timing between an internal clock of the memory device and a command in a gear down mode of a memory device includes detecting a sync pulse at rising and falling edges of the internal clock, and adjusting a timing between the internal clock of the memory device and the command according to the detection result.

In accordance with another exemplary embodiment of the present invention, a semiconductor memory device includes a detection unit configured to detect a sync pulse at rising and falling edges of an internal clock used in a gear down mode, and a transfer unit configured to transfer the detection result of the detection unit to a memory controller.

In accordance with another exemplary embodiment of the present invention, a memory system includes a memory device including a detection unit configured to detect a sync pulse at rising and falling edges of an internal clock used in a gear down mode, and a transfer unit configured to transfer a detection result of the detection unit, and a memory controller configured to adjust a timing between an internal clock of the memory device and a command to be applied to the memory device, in response to the detection result transferred from the transfer unit of the memory device.

In accordance with another exemplary embodiment of the present invention, a semiconductor memory device includes a detection unit configured to detect a sync pulse at rising and falling edges of an internal clock used in a gear down mode, and an internal clock adjusting unit configured to adjust a timing of the internal clock in response to a detection result of the detection unit.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2A:
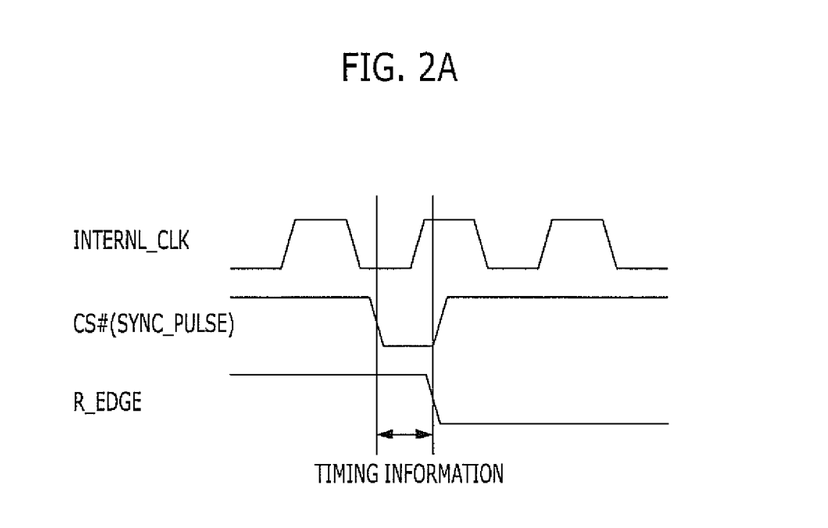
FIGS. 2A and 2B illustrate the relationship between a sync pulse and an internal clock when the sync pulse has a pulse width corresponding to a half cycle of the internal clock.
Figure 2B:
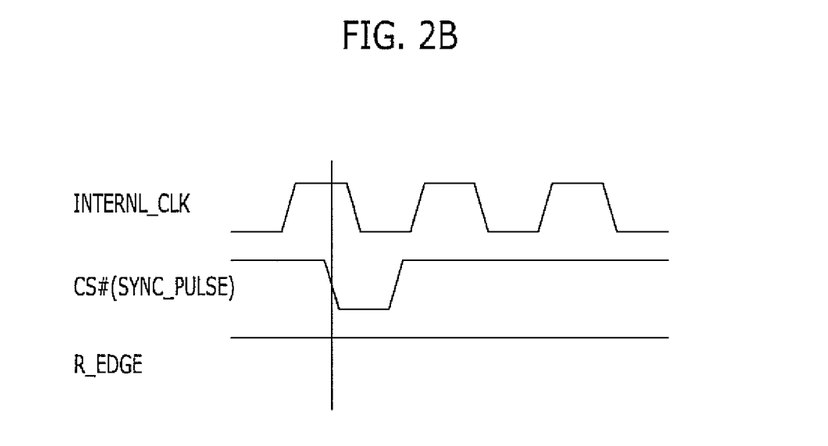

FIGS. 2A and 2B illustrate the relationship between a sync pulse SYNC_PULSE and an internal clock INTERNAL_CLK in case that the sync pulse SYNC_PULSE has a pulse width corresponding to a half cycle of the internal clock INTERNAL_CLK.

Referring to FIG. 2A, a rising edge of the internal clock INTERNAL_CLK falls within a time period in which the sync pulse SYNC_PULSE applied via a pad through which a chip select signal CS# is inputted is activated to a low level. Therefore, the timing relationship between the sync pulse SYNC_PULSE and the internal clock INTERNAL_CLK can be known by detecting the sync pulse SYNC_PULSE using the rising edge of the internal clock INTERNAL_CLK. In the drawings, a reference symbol R_EDGE represents the sync pulse SYNC_PULSE which is detected at the rising edge of the internal clock INTERNAL_CLK.

Referring to FIG. 2B, the rising edge of the internal clock INTERNAL_CLK does not fall within a time period in which the sync pulse SYNC_PULSE is activated to a low level. Therefore, the sync pulse SYNC_PULSE may not be detected by using the rising edge of the internal clock INTERNAL_CLK. It can be seen from FIG. 2B that the signal R_EDGE continuously maintains a high level and thus has no timing information. In this case, it may be difficult to know the timing relationship between the sync pulse SYNC_PULSE and the internal clock INTERNAL_CLK. That is, it may be difficult to adjust the timing between the command and the internal clock INTERNAL_CLK.

These results may be caused from the fact that the internal clock INTERNAL_CLK having half the frequency of the data clocks CK and CK# is used in the gear down mode, the pulse width of the sync pulse SYNC_PULSE is set to one cycle of the data clocks (full rate clocks) CK and CK#, and the sync pulse SYNC_PULSE is detected at either rising or falling edge of the internal clock INTERNAL_CLK.

Therefore, these results does not be caused if the pulse width of the sync pulse SYNC_PULSE is set to one cycle of the internal clock INTERNAL_CLK (two cycles of the data clocks CK and CK#) and the sync pulse SYNC_PULSE is detected at both the rising and falling edges of the internal clock INTERNAL_CLK.

Figure 3:
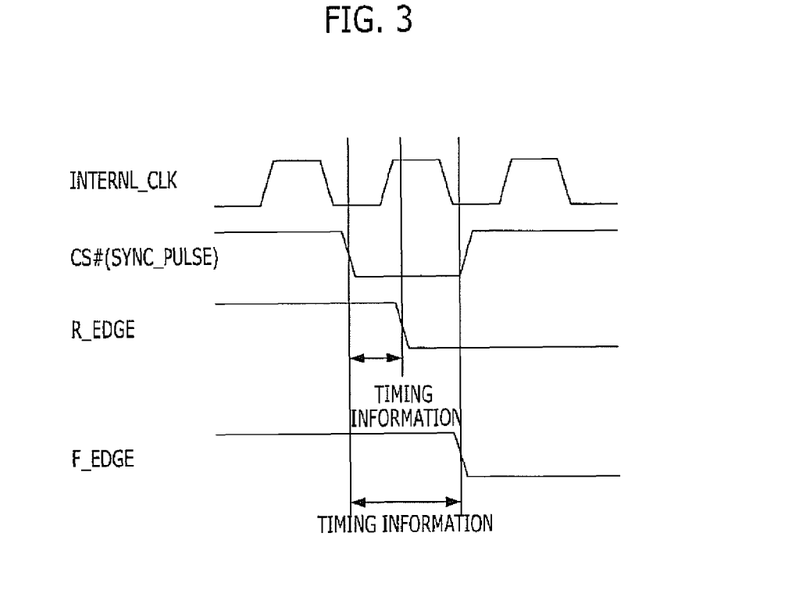
FIG. 3 illustrates a method for detecting a sync pulse by using an internal clock in accordance with an embodiment of the present invention.

FIG. 3 illustrates a method for detecting a sync pulse SYNC_PULSE by using an internal clock INTERNAL_CLK in accordance with an exemplary embodiment of the present invention.

Referring to FIG. 3, the sync pulse SYNC_PULSE may have a pulse width corresponding to one cycle of the internal clock INTERNAL_CLK. A first detection signal R_EDGE is generated if the sync pulse SYNC_PULSE is detected at the rising edge of the internal clock INTERNAL_CLK. A second detection signal F_EDGE is generated if the sync pulse SYNC_PULSE is detected at the falling edge of the internal clock INTERNAL_CLK. Since the first detection signal R_EDGE and the second detection signal F_EDGE may contain information on the timing between the sync pulse SYNC_PULSE and the internal clock INTERNAL_CLK, the timing between the internal clock INTERNAL_CLK and the command may be adjusted using this information.

Since the sync pulse SYNC_PULSE may be detected at both of the rising and falling edges of the internal clock INTERNAL_CLK, that is, the timing information may be loaded onto at least one of the first detection signal R_EDGE and the second detection signal F_EDGE, the timing between the internal clock INTERNAL_CLK and the command may be adjusted.

Figure 4:
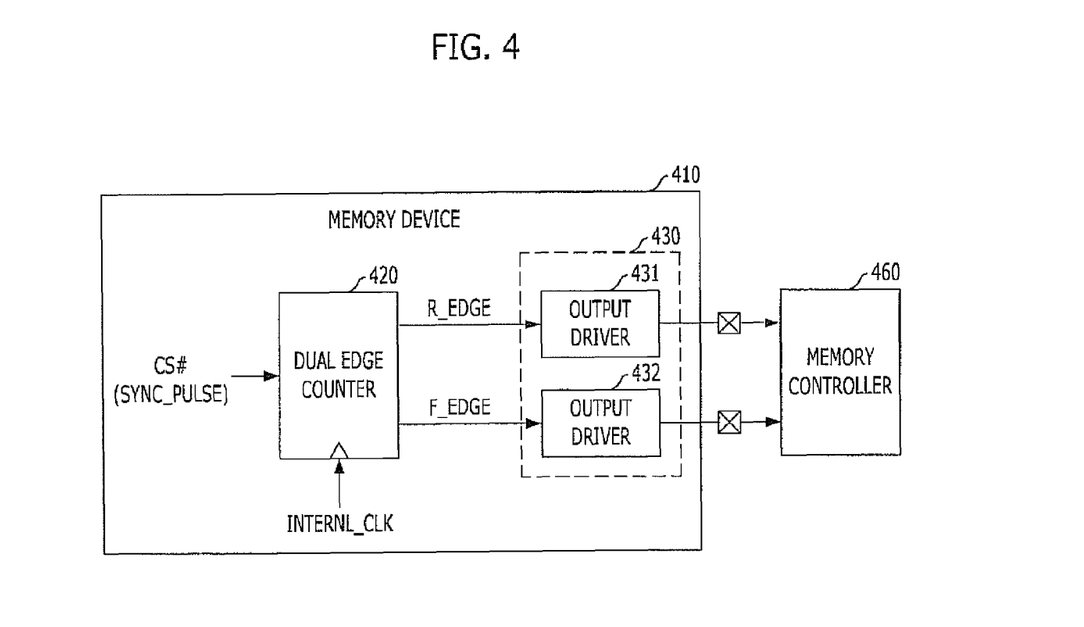
FIG. 4 is a configuration diagram of a memory system in accordance with an embodiment of the present invention.

FIG. 4 is a configuration diagram of a memory system in accordance with an exemplary embodiment of the present invention.

Referring to FIG. 4, the memory system includes a memory device 410 and a memory controller 460. The memory device 410 includes a detection unit 420 configured to detect a sync pulse SYNC_PULSE at rising and falling edges of an internal clock INTERNAL_CLK used in a gear down mode, and a transfer unit 430 configured to transfer the detection results R_EDGE and F_EDGE of the detection unit 420 to the memory controller 460. The memory controller 460 is configured to adjust a timing between an internal clock of the memory device and a command to be applied to the memory device 410, in response to the detection results R_EDGE and F_EDGE transferred from the transfer unit 430.

In order to detect the timing between the internal clock INTERNAL_CLK and the command in the gear down mode, the sync pulse SYNC_PULSE may be applied from the memory controller 460 to the memory device 410. The sync pulse SYNC_PULSE may be applied via a pad through which a chip select signal CS# is applied, or may be applied via other pads. The sync pulse SYNC_PULSE may have a pulse width equal to one cycle of the internal clock INTERNAL_CLK (two cycles of the data clocks CK and CK#).

The detection unit 420 may detect the sync pulse SYNC_PULSE applied to the memory device 410 at both the rising and falling edges of the internal clock INTERNAL_CLK. As illustrated in FIG. 4, the detection unit 420 may include a dual edge counter. The dual edge counter outputs the first detection signal R_EDGE having a low level if the activation of the sync pulse SYNC_PULSE is detected at least once at the rising edge of the internal clock INTERNAL_CLK. In addition, the dual edge counter outputs the second detection signal F_EDGE having a low level if the activation of the sync pulse SYNC_PULSE is detected at least once at the falling edge of the internal clock INTERNAL_CLK. On the other hand, the dual edge counter outputs the first detection signal F_EDGE having a high level if the activation of the sync pulse SYNC_PULSE is not detected at the rising edge of the internal clock INTERNAL_CLK. In addition, the dual edge counter outputs the second detection signal F_EDGE having a high level if the activation of the sync pulse SYNC_PULSE is not detected at the falling edge of the internal clock INTERNAL_CLK. The operation of the dual edge counter will be understood more clearly with reference to FIG. 3.

The transfer unit 430 may transfer the detection results R_EDGE and F_EDGE of the detection unit 420 to the memory controller 460. The transfer unit 430 includes output drivers 431 and 432 configured to output the detection results R_EDGE and F_EDGE. The detection results R_EDGE and F_EDGE may be transferred to the memory controller 460 through pads, such as DQ pads, which are configured to exchange information between the memory device 410 and the memory controller 460.

The memory controller 460 may adjust the timing between an internal clock of the memory device and a command. For example, the memory controller 460 may adjust the timing of the command by using the received detection results R_EDGE and F_EDGE. The detection results R_EDGE and F_EDGE containing the information on the timing between the sync pulse SYNC_PULSE applied to the memory device 410 and the internal clock INTERNAL_CLK of the memory device may be fed back to the memory controller 460, and the memory controller 460 may adjust the timing of the command by using the fed-back detection results R_EDGE and F_EDGE to adjust the timing between the command and the internal clock INTERNAL_CLK.

The overall operation of adjusting the timing between the internal clock INTERNAL_CLK and the command in the gear down mode will be described below. First, the sync pulse SYNC_PULSE applied from the memory controller 460 may be detected at the rising and falling edges of the internal clock INTERNAL_CLK of the memory device. The detection results R_EDGE and F_EDGE may contain the information on the timing between the sync pulse SYNC_PULSE and the internal clock INTERNAL_CLK, and the detection results R_EDGE and F_EDGE may be transferred to the memory controller 460. The memory controller 460 may adjust the timing between the internal clock INTERNAL_CLK and the command by using the fed-back detection results R_EDGE and F_EDGE.

Figure 5:
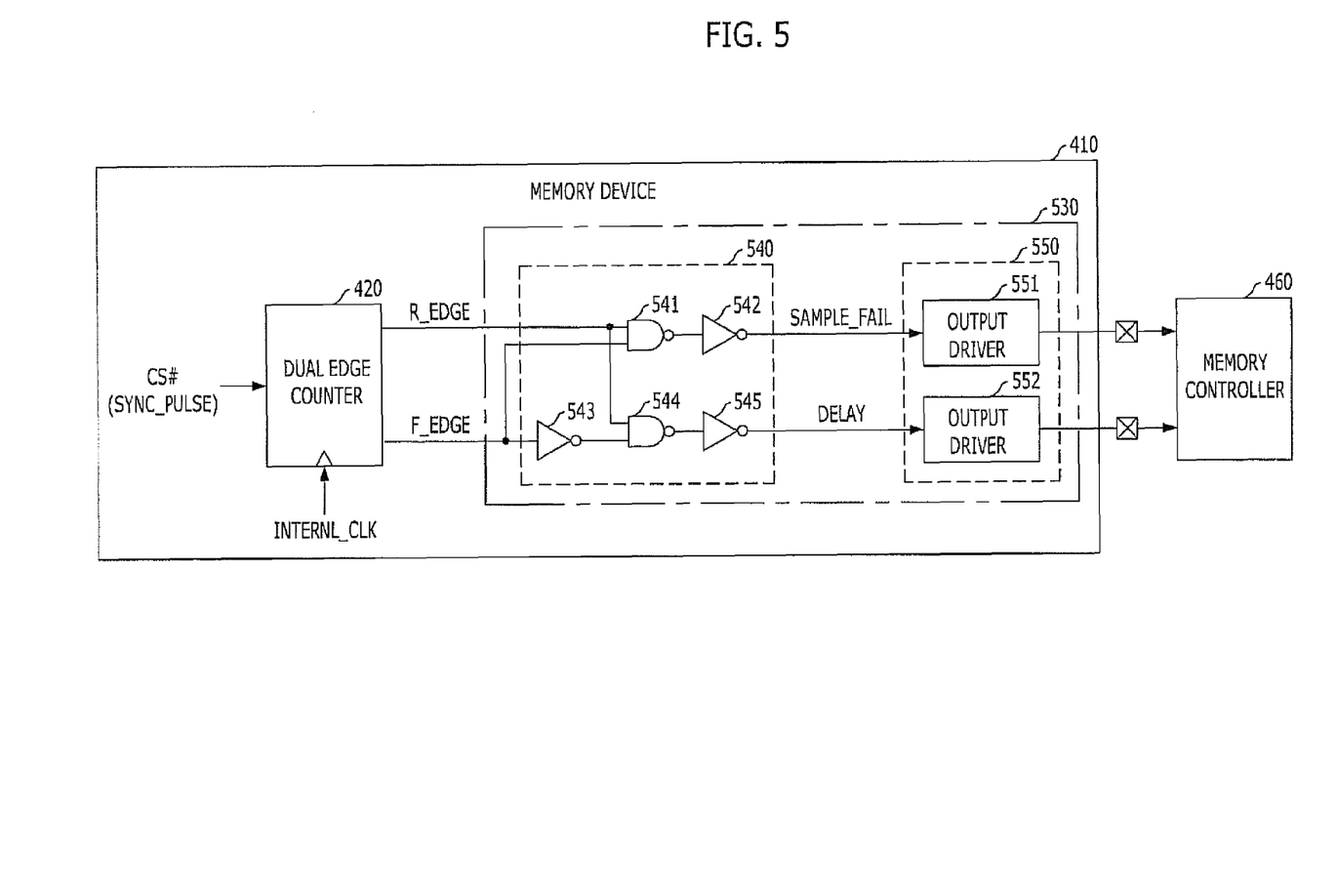
FIG. 5 is a configuration diagram of a memory system in accordance with another embodiment of the present invention.

FIG. 5 is a configuration diagram of a memory system in accordance with another exemplary embodiment of the present invention.

A transfer unit 530 of FIG. 5 has a structure different from that of FIG. 4. Referring to FIG. 5, the transfer unit 530 may transfer detection results R_EDGE and F_EDGE of a detection unit 420 to a memory controller 460, but it may perform information processing and transfer processed information.

The transfer unit 530 may include an operation section 540 configured to perform a logic operation on the detection results R_EDGE and F_EDGE of the detection unit 420, and an output section 550 configured to output the operation results SAMPLE_FAIL and DELAY of the operation section 540 to the memory controller 460.

After the detection operation of the detection unit 420, if the first detection signal R_EDGE is at a high level, according to an example, it means that the activation of the sync pulse SYNC_PULSE is not detected at the rising edge of the internal clock INTERNAL_CLK. If the first detection signal R_EDGE is at a low level, according to an example, it means that the activation of the sync pulse SYNC_PULSE is detected at least once at the rising edge of the internal clock INTERNAL_CLK. In addition, after the detection operation of the detection unit 420, if the second detection signal F_EDGE is at a high level, it means that the activation of the sync pulse SYNC_PULSE is not detected at the falling edge of the internal clock INTERNAL_CLK. If the second detection signal F_EDGE is at a low level, it means that the activation of the sync pulse SYNC_PULSE is detected at least once at the falling edge of the internal clock INTERNAL_CLK.

The operation section 540 may include NAND gates 541 and 544 and inverters 542, 543 and 545. The operation section 540 deactivates the delay signal DELAY to a low level if (R_EDGE, F_EDGE) is (low, high) or (low, low). That the first detection signal R_EDGE is at a low level may mean that the activation of the sync pulse SYNC_PULSE is detected at the rising edge of the internal clock INTERNAL_CLK. Therefore, it is presumed that the command having the same timing as the sync pulse SYNC_PULSE will be validly detected at the rising edge of the internal clock INTERNAL_CLK. In this case, the delay signal DELAY may be deactivated, and the memory controller 460 may not adjust the timing of the command.

The operation section 540 may activate the delay signal DELAY to a high level when (R_EDGE, F_EDGE) is (high, low). That the first detection signal R_EDGE is at a high level and the second detection signal F_EDGE is at a low level may mean that the sync pulse SYNC_PULSE is not detected at the rising edge of the internal clock INTERNAL_CLK, but detected only at the falling edge of the internal clock INTERNAL_CLK. In this case, since the timing of the command need not be changed, the delay signal DELAY may be activated to control the memory controller 460 to adjust the timing of the command.

The operation section 540 may activate the detection fail signal SAMPLE_FAIL to a high level when (R_EDGE, F_EDGE) is (high, high). That both of the first detection signal R_EDGE and the second detection signal F_EDGE are at a high level may mean that the sync pulse SYNC_PULSE is not detected at both the rising and falling edges of the internal clock INTERNAL_CLK. In such a situation, no information on the timing between the internal clock INTERNAL_CLK and the sync pulse SYNC_PULSE may be generated. Therefore, in this case, the information indicating the detection fail may be generated. Since the case in which the sync pulse SYNC_PULSE is not detected at both the rising and falling edges of the internal clock INTERNAL_CLK almost never occur, a part of the operation section 540 which generates the defection fail signal SAMPLE_FAIL is optional. That is, the NAND gate 541 and the inverter 542 is optional in the operation section 540.

The output section 550 may include output drivers 551 and 552 configured to output the operation results DELAY and SAMPLE_FAIL of the operation section 540 to the memory controller 460.

If the delay signal DELAY is deactivated, the memory controller 460 applies the command to the memory device 410 at the same timing as the sync pulse SYNC_PULSE. However, if the delay signal DELAY is activated, the memory controller 460 applies the command to the memory device 410 at the timing which is delayed from the sync pulse SYNC_PULSE by the half cycle of the internal clock INTERNAL_CLK with reference to the internal clock INTERNAL_CLK. In addition, if the detection fail signal SAMPLE_FAIL is activated, the operation of adjusting the timing between the command and the internal clock INTERNAL_CLK including detection of the sync pulse is resumed.

Since the operation of the detection unit 420 of FIG. 5 may be performed in the substantially same manner as in FIG. 4, a detailed description thereof will be omitted.

The overall operation of adjusting the timing between the internal clock INTERNAL_CLK and the command in the gear down mode will be described below. First, the sync pulse SYNC_PULSE applied from the memory controller 460 may be detected at the rising and falling edges of the internal clock INTERNAL_CLK of the memory device 410. If the activation of the sync pulse SYNC_PULSE is detected at the rising edge of the internal clock (R_EDGE='low'), information instructing that the timing of the command is available is transferred from the memory device 410 to the memory controller 460. If the activation of the sync pulse SYNC_PULSE is not detected at the rising edge of the internal clock INTERNAL_CLK (R_EDGE='high') and the activation of the sync pulse SYNC_PULSE is detected at the falling edge of the internal clock INTERNAL_CLK (F_EDGE='low'), information instructing that the timing of the command to be adjusted is transferred from the memory device 410 to the memory controller 460. The memory controller 460 may adjust the timing of the command according to the information transferred from the memory device 410. If the sync pulse SYNC_PULSE is not detected at both the rising and falling edges of the internal clock INTERNAL_CLK, the memory device 410 transfers information indicating the detection fail of the sync pulse SYNC_PULSE to the memory controller 460, and the memory controller 460 may resume the operation of adjusting the timing between the command and the internal clock INTERNAL_CLK.

Figure 6:
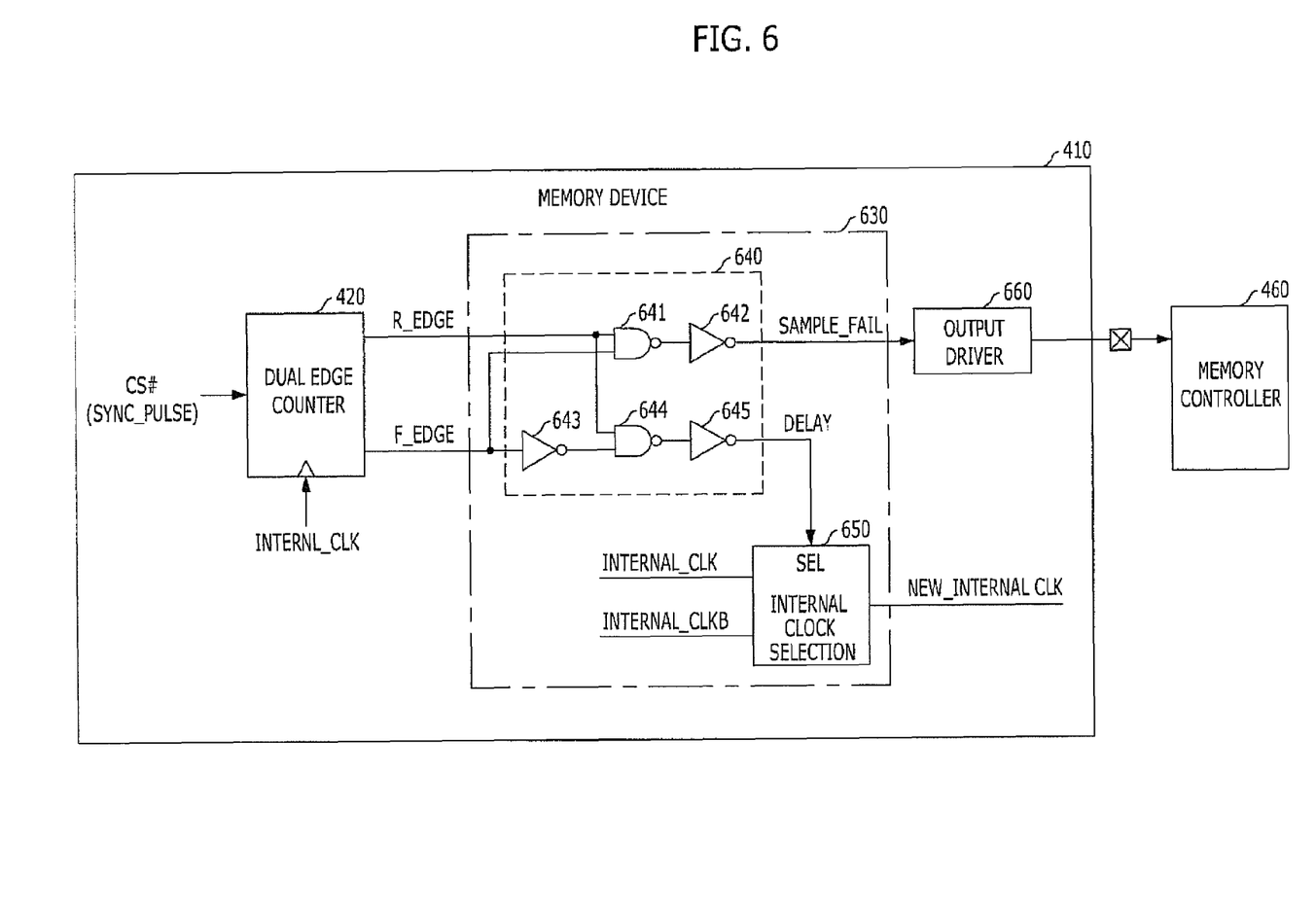
FIG. 6 is a configuration diagram of a memory system in accordance with another embodiment of the present invention.

FIG. 6 is a configuration diagram of a memory system in accordance with another embodiment of the present invention.

In the embodiments of FIGS. 4 and 5, the memory device 410 may detect the timing relationship between the internal clock INTERNAL_CLK and the sync pulse SYNC_PULSE, and may transfer the detected timing relationship to the memory controller 460, and the memory controller 460 may adjust the timing of the command by using the information transferred from the memory device 410. In this way, the timing between the internal clock INTERNAL_CLK and the command may be adjusted. On the other hand, in the embodiment of FIG. 6, the memory device 410 may adjust the timing between the internal clock INTERNAL_CLK and the command by adjusting the timing of the internal clock INTERNAL_CLK itself.

Referring to FIG. 6, a memory device 410 includes a detection unit 420 configured to detect a sync pulse SYNC_PULSE at rising and falling edges of an internal clock INTERNAL_CLK used in a gear down mode, and an internal clock adjusting unit 630 configured to adjust a timing of the internal clock INTERNAL_CLK in response to detection results R_EDGE and F_EDGE of the detection unit 420.

The internal clock adjusting unit 630 may include an operation section 640 configured to perform a logic operation on the detection results R_EDGE and F_EDGE of the detection unit 420, and an internal clock selection section 650 configured to use the internal clock INTERNAL_CLK or an inverted internal clock INTERNAL_CLKB as a new internal clock NEW_INTERNAL_CLK according to the operation result DELAY of the operation section 640.

The configuration and operation of the operation section 640 may be arranged to be substantially identical to those of the operation section 540 illustrated in FIG. 5. Parts 641 and 642 which generate the detection fail signal SAMPLE_FAIL may not be arranged. If the delay signal DELAY is deactivated, the internal clock selection section 650 selects the internal clock INTERNAL_CLK, which is being currently used, as the new internal clock NEW_INTERNAL_CLK (INTERNAL_CLK=NEW_INTERNAL_CLK). In this case, the internal clock INTERNAL_CLK may not be changed. If the delay signal DELAY is activated, the internal clock selection section 650 selects the inverted internal clock INTERNAL_CLKB as the new internal clock NEW_INTERNAL_CLK (INTERNAL_CLKB=NEW_INTERNAL_CLK). In this case, the new internal clock NEW_INTERNAL_CLK may become the clock INTERNAL_CLKB which is obtained by inverting the internal clock INTERNAL_CLK. That is, the phase of the internal clock INTERNAL_CLK is shifted by 180 degrees. The internal clock selection section 650 may be implemented with a multiplexer.

The detection fail signal SAMPLE_FAIL generated by the operation section 640 may be outputted to the memory controller 460 through the output section 660 provided with output drivers. Like in the embodiment of FIG. 5, the parts related to the generation and output of the detection fail signal SAMPLE_FAIL may not be arranged.

In order to adjust the timing between the internal clock INTERNAL_CLK and the command, the timing of the internal clock INTERNAL_CLK or the command may be changed. In the embodiments of FIGS. 4 and 5, the method of changing the timing of the command may be used. In the embodiment of FIG. 6, the method of changing the timing of the internal clock may be used. Therefore, it can be expected that the embodiments of FIGS. 4 and 5 and the embodiment of FIG. 6 will obtain the same effect.

The overall operation of adjusting the timing between the internal clock INTERNAL_CLK and the command in the gear down mode will be described below. First, the sync pulse SYNC_PULSE applied from the memory controller 460 may be detected at the rising and falling edges of the internal clock INTERNAL_CLK of the memory device. Using the detection result, the memory device 410 may adjust the timing of the internal clock INTERNAL_CLK. Specifically, if the activation of the sync pulse SYNC_PULSE is detected at the rising edge of the internal clock INTERNAL_CLK, the memory device 410 uses the internal clock INTERNAL_CLK as it is. If the activation of the sync pulse SYNC_PULSE is detected at not the rising edge but the falling edge of the internal clock INTERNAL_CLK, the memory device 410 selects the inverted internal clock INTERNAL_CLKB as the new internal clock NEW_INTERNAL_CLK. Therefore, the timing between the internal clock INTERNAL_CLK and the command may be adjusted. If the sync pulse SYNC_PULSE is not detected at both of the rising and falling edges of the internal clock INTERNAL_CLK, the memory device 410 transfers information indicating the detection fail of the sync pulse SYNC_PULSE to the memory controller 460, and the memory controller 460 controls the memory device 410 to resume the operation of adjusting the timing between the command and the internal clock INTERNAL_CLK.

In accordance with the exemplary embodiments of the present invention, the sync pulse may be detected at the rising and falling edges of the internal clock, and the timing between the internal clock and the command is adjusted.

Furthermore, the flexibility of design may be ensured because the memory controller may provide various timing adjusting methods, for example, the method which adjusts the timing of the command and the method which adjusts the timing of the internal clock itself.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a detection unit configured to detect a sync pulse at all of rising and falling edges of an internal clock within a single pulse width of the sync pulse, wherein the single pulse width of the sync pulse corresponds to one cycle of the internal clock used in a gear down mode; and
    a transfer unit configured to transfer the detection result of the detection unit to a memory controller,
    wherein the transfer unit comprises:
        an operation section configured to perform a logic operation on the detection result of the detection unit, wherein the operation section is configured to generate the operation result which contains information that current internal clock is available if the activation of the sync pulse is detected at the rising edge of the internal clock, and to generate the operation result to delay a command if the activation of the sync pulse is not detected at the rising edge of the internal clock and detected at the falling edge of the internal clock.

2. The semiconductor memory device of claim 1, wherein the transfer unit further comprises:
    an output section configured to output the operation result of the operation section to the memory controller.

3. The semiconductor memory device of claim 1, wherein the operation section is configured to generate the operation result which contains information indicating that the detection of the sync pulse is failed if the activation of the sync pulse is not detected at both the rising and falling edges of the internal clock.

4. A memory system, comprising:
    a memory device comprising a detection unit configured to detect a sync pulse at all of rising and falling edges of the internal clock within a single pulse width of the sync pulse, wherein the single pulse width of the sync pulse corresponds to one cycle of the internal clock used in a gear down mode, and a transfer unit configured to transfer a detection result of the detection unit; and a memory controller configured to adjust a timing between an internal clock of the memory device and a command to be applied to the memory device, in response to the detection result transferred from the transfer unit of the memory device, wherein the transfer unit comprises:
an operation section configured to perform a logic operation on the detection result of the detection unit,
wherein the operation section is configured to generate the operation result which contains information that current internal clock is available if the activation of the sync pulse is detected at the rising edge of the internal clock, and to generate the operation result, wherein the operation result is used to delay the command if the activation of the sync pulse is not detected at the rising edge of the internal clock and detected at the falling edge of the internal clock.

5. The memory system of claim 4, wherein the transfer unit further comprises:
an output section configured to output an operation result of the operation section to the memory controller.

6. The memory system of claim 4, wherein the operation section is configured to generate the operation result which contains information indicating that the detection of the sync pulse is failed if the activation of the sync pulse is not detected at both the rising and falling edges of the internal clock.

7. A semiconductor memory device, comprising:
a detection unit configured to detect a sync pulse at all of rising and falling edges of the internal clock within a single pulse width of the sync pulse, wherein the single pulse width of the sync pulse corresponds to one cycle of the internal clock used in a gear down mode; and
an internal clock adjusting unit configured to adjust a timing of the internal clock in response to a detection result of the detection unit,
wherein the internal clock adjusting unit comprises:
an operation section configured to perform a logic operation on the detection result of the detection unit,
wherein the operation section is configured to generate the operation result which contains information that current internal clock is available if the activation of the sync pulse is detected at the rising edge of the internal clock, and to generate the operation result, wherein the operation result is used to delay the command if the activation of the sync pulse is not detected at the rising edge of the internal clock and detected at the falling edge of the internal clock.

8. The semiconductor memory device of claim 7, wherein the internal clock adjusting unit further comprises:
an internal clock selection section configured to select the internal clock or an inverted internal clock according to the detection result of the operation section.

9. The semiconductor memory device of claim 8, wherein the operation section is configured to transfer information, which indicates that the current internal clock is available, to the internal clock selection section if the activation of the sync pulse is detected at the rising edge of the internal clock, and to transfer information, which instructs the internal clock selection section to use the inverted internal clock as a new internal clock, to the internal clock selection section if the activation of the sync pulse is not detected at the rising edge of the internal clock and detected at the falling edge of the internal clock.

10. The semiconductor memory device of claim 9, wherein the operation section is configured to generate information indicating that the detection of the sync pulse fails, if the activation of the sync pulse is not detected at both the rising and falling edge of the internal clock, wherein the semiconductor memory devices further comprises an output unit configured to output the information to a memory controller.

11. The semiconductor memory device of claim 10, wherein the sync pulse is applied to the memory device via a pad through which a chip select signal is inputted.

12. The semiconductor memory device of claim 1, wherein the detection unit comprises a dual edge counter.

13. The semiconductor memory device of claim 7, wherein the detection unit comprises a dual edge counter.

* * * * *